(12) United States Patent
Ho et al.

(10) Patent No.: US 10,008,794 B2
(45) Date of Patent: *Jun. 26, 2018

(54) OPERATION MEMBER AND ELECTRONIC DEVICES HAVING THE SAME

(71) Applicants: LITE-ON ELECTRONICS (GUANGZHOU) LIMITED, Guangzhou (CN); LITE-ON TECHNOLOGY CORPORATION, Taipei (TW)

(72) Inventors: Chun-Lung Ho, Hsinchu County (TW); Yi-Hsun Lee, Taoyuan County (TW); Ming-Wei Ou, Taipei (TW); Yuan-Fu Lin, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

(*) Notice: Subject to any disclaimer, the term of this patent is extended or adjusted under 35 U.S.C. 154(b) by 0 days. days.

This patent is subject to a terminal disclaimer.

(21) Appl. No.: 15/488,974

(22) Filed: Apr. 17, 2017

(65) Prior Publication Data

US 2017/0222343 A1 Aug. 3, 2017

Related U.S. Application Data

(63) Continuation of application No. 14/615,874, filed on Feb. 6, 2015, now Pat. No. 9,684,330.

(30) Foreign Application Priority Data

May 16, 2014 (CN) ..................... 2014 2 0254696 U (51) Int. Cl.
*H01C 10/32* (2006.01)
*H01R 12/71* (2011.01)
(Continued)

(52) U.S. Cl.
CPC ............. *H01R 12/714* (2013.01); *G05G 1/10* (2013.01); *G05G 25/04* (2013.01); *H01C 1/06* (2013.01);
(Continued)

(58) Field of Classification Search
CPC .......... H01H 13/06; H01H 23/06; H01H 9/04; H01C 1/06; H01R 12/714; H01R 13/447
(Continued)

(56) References Cited

U.S. PATENT DOCUMENTS 5,258,592 A * 11/1993 Nishikawa ........... H01H 13/063
200/302.2
5,471,022 A * 11/1995 Kiss ....................... H01H 35/34
200/302.1

(Continued)

*Primary Examiner* — Kyung Lee
(74) *Attorney, Agent, or Firm* — Li & Cal Intellectual Property (USA) Office (57) ABSTRACT

An operation member for an electronic device is provided. The electronic device includes a casing having portions defining an opening and a circuit module having a circuit board. The circuit board includes a controller. The operation member includes a body including an operating end and a coupling end, and a skirt member. The body is configured to partially protrude through the opening of the casing for operating. The skirt member is arranged at the coupling end. The skirt member includes a base plate outwardly extending from the coupling end, a wall upwardly extending from peripheral portions of the base plate, and a groove defined between the wall and the body. The operation member is configured to associate with the electronic device, and the operation member with the body and the skirt is completely separated from the casing.

18 Claims, 8 Drawing Sheets

(51) Int. Cl.
*G05G 1/10* (2006.01)
*H05K 5/00* (2006.01)
*G05G 25/04* (2006.01)
*H05K 5/02* (2006.01)
*H01C 1/06* (2006.01)
*H01R 13/447* (2006.01)

(52) U.S. Cl.
CPC ......... *H01R 13/447* (2013.01); *H05K 5/0017* (2013.01); *H05K 5/0239* (2013.01)

(58) Field of Classification Search
USPC ....................................... 338/164; 200/302.1
See application file for complete search history.

(56) References Cited

U.S. PATENT DOCUMENTS

| | | | | |
|---|---|---|---|---|
| 5,734,136 | A * | 3/1998 | Newcomer | H01H 13/702 200/302.1 |
| 6,437,267 | B1 * | 8/2002 | Imai | H01H 13/702 200/302.1 |
| 7,319,201 | B2 * | 1/2008 | Kawai | B23Q 11/0858 200/302.1 |
| 7,355,137 | B2 * | 4/2008 | Kawasaki | H01H 13/86 200/302.1 |
| 8,263,886 | B2 * | 9/2012 | Lin | H01H 13/063 200/302.2 |
| 9,684,330 | B2 * | 6/2017 | Ho | H05K 5/0239 |
| 2008/0302641 | A1 * | 12/2008 | Su | H01H 9/04 200/302.3 |
| 2011/0005908 | A1 * | 1/2011 | Lin | H01H 13/063 200/302.2 |
| 2013/0001055 | A1 * | 1/2013 | Ohata | H04M 1/0237 200/293 |

* cited by examiner

FIG.8 ed and includes a base plate outwardly extending from peripheral portions of the coupling end, a wall upwardly extending from peripheral portions of the base plate, and a groove defined between the wall and the body. The circuit module has a circuit board. The circuit board includes a controller disposed thereon. The operation member is sleeved onto the controller and the body of the operation member passes through the opening. The body and the opening cooperatively define a gap therebetween, and the groove is correspondingly arranged beneath the gap. The operation member with the body and the skirt is completely separated from the casing.

According to another embodiment of the instant disclosure, an operation member is provided. The operation member comprises a body including an operating end for operating and a coupling end, and a skirt member arranged on the coupling end. The skirt member including a base plate outwardly extending from peripheral portions of the coupling end, a wall upwardly extending from peripheral portions of the base plate, and a groove defined between the wall and the body. The skirt member and the body of the operation member are unitarily formed as a one piece structure.

The skirt member of the operation member in the present disclosure can gather and prevent small particles, such as dust or wood chips, from entering through the gap between the casing and the operation member and into the electronic device. Thus, circuit boards and electrical components damage due to small particles entering the circuit module as well as reduction of product life of the electronic device is prevented.

In order to further understand the instant disclosure, the following embodiments and illustrations are provided. However, the detailed description and drawings are merely illustrative of the disclosure, rather than limiting the scope being defined by the appended claims and equivalents thereof.

OPERATION MEMBER AND ELECTRONIC DEVICES HAVING THE SAME

CROSS REFERENCE TO RELATED APPLICATION

This application is a continuation application of U.S. application Ser. No. 14/615,874, filed on Feb. 6, 2015, and entitled "OPERATION MEMBER AND ELECTRONIC DEVICES HAVING THE SAME", the entire contents of which are hereby incorporated by reference.

BACKGROUND OF THE INVENTION

1. Field of the Invention

The instant disclosure relates to an operation member and electronic devices having the same; in particular, to an operation member having a skirt member and an electronic device having the same.

2. Description of Related Art

Typically, knobs on electronic devices are commonly assembled with a knob sleeved onto a variable resistor. In order to provide smooth rotation, the knob and casing of the electronic device are assembled with a predetermined gap therebetween to avoid physical interference. However, when electronic devices are used in relatively poor operating environments, small particles such as powder, wood chips, dust, or any suspended particles can easily enter through the gap and gather on circuit boards inside the electronic device, which may cause damages due to short circuiting or reduce product life of electronic components on the circuit boards. Thus, the product life of the electronic device is substantially reduced which indirectly leads to cost up.

SUMMARY OF THE INVENTION

One aspect of the instant disclosure provides an operation member and an electronic device having the operation member to prevent small particles from easily entering through the gap between the operation member and the casing of the electronic device and gathering on circuit boards, which may cause damage due to short circuiting or reduce product life of electronic components.

According to an embodiment of the instant disclosure, an operation member for an electronic device is provided. The electronic device comprises a casing having portions defining an opening, and a circuit module having a circuit board. The circuit board includes a controller disposed thereon. The operation member comprises a body and a skit member. The body includes an operating end and a coupling end, and is configured to partially protrude through the opening of the casing for operating. The skirt member is arranged on the coupling end and includes a base plate outwardly extending from peripheral portions of the coupling end, a wall upwardly extending from peripheral portions of the base plate, and a groove defined between the wall and the body. The operation member is configured to associate with the electronic device, and the operation member with the body and the skirt is completely separated from the casing.

According to another embodiment of the instant disclosure, an electronic device is provided. The electronic device comprises a casing having portions defining an opening, an operation member and a circuit module. The operation member comprises a body including an operating end and a coupling end, and a skirt member. The body is configured to partially protrude through the opening of the casing for operating. The skirt member is arranged on the coupling end

DETAILED DESCRIPTION OF THE PREFERRED EMBODIMENTS

The aforementioned illustrations and detailed descriptions are exemplarities for the purpose of further explaining the scope of the instant disclosure. Other objectives and advantages related to the instant disclosure will be illustrated in the subsequent descriptions and appended drawings.

Figure 1:
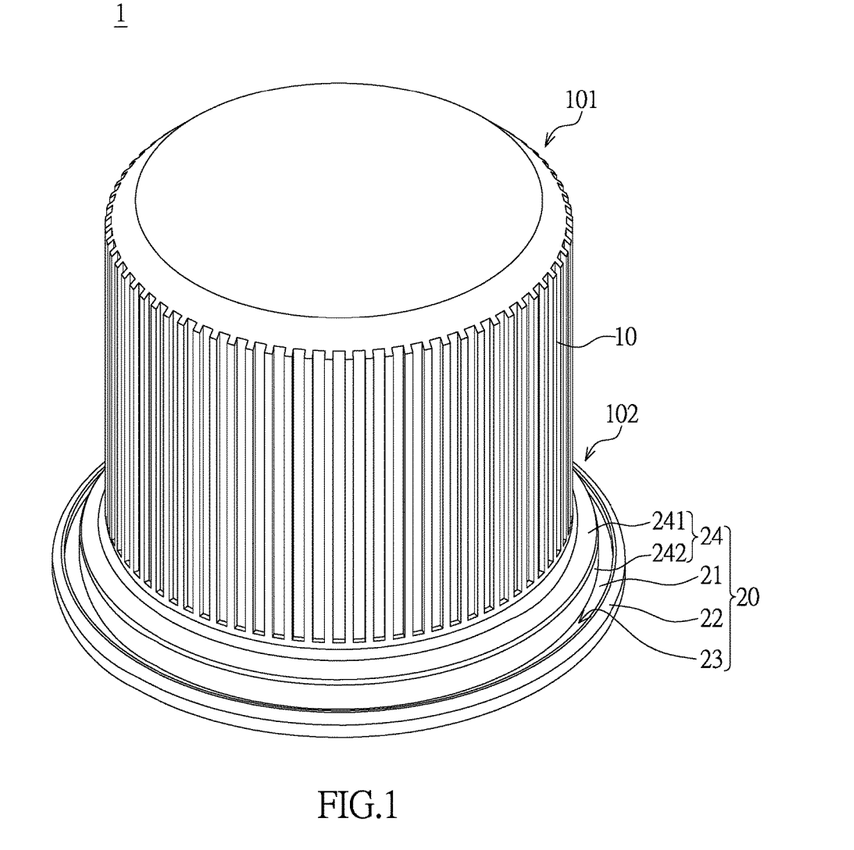
FIG. 1 is a perspective view of an operation member in accordance with the instant disclosure.
Figure 2:
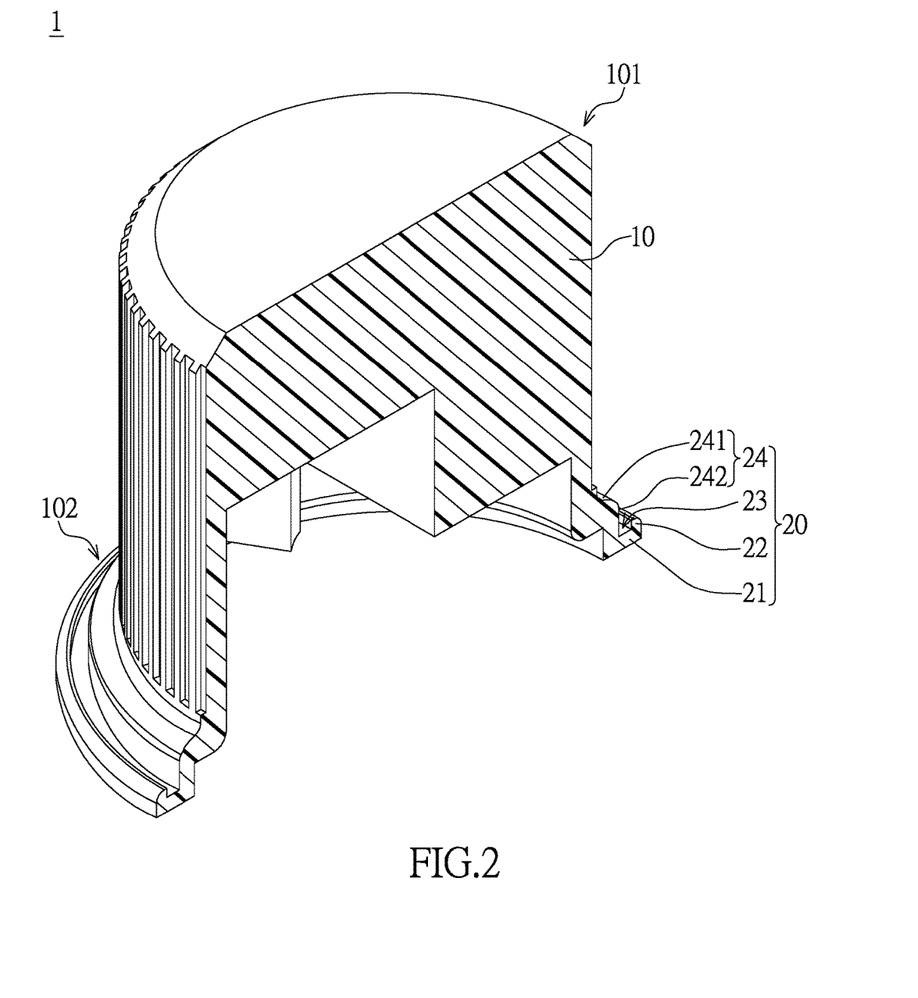
FIG. 2 is a cross-sectional view of the operation member in accordance with the instant disclosure.

FIGS. 1 and 2 illustrate schematic diagrams of an operation member in accordance with the instant disclosure. The operation member 1 includes a body 10 and a skirt member 20. The body 10 includes an operating end 101 and a coupling end 102. The operating end 101 provides grip for users. The skirt member 20 is a structure that is arranged at the coupling end 102. The skirt member 20 includes a base plate 21, a wall 22, and a groove 23. The operation member may be a push button, a knob etc. In this embodiment, the operation member as illustrated is a rotary knob for a purpose which will hereafter be made clear.

Referring to FIGS. 1 and 2, the knob 1 includes a body 10 and a skirt member 20. The body 10 includes an operating end 101 and a coupling end 102. When the body 10 is rotated, the operating end 101 can further provide an anti-slip structure (not shown in figures) or relevant indication or instructive structures (not shown in figures) as necessary, but not limited to the examples provided hereto.

Skirt member 20 is arranged at the coupling end 102. The skirt member 20 includes a base plate 21, a wall 22, and a groove 23. The base plate 21 outwardly extends from the coupling end 102 of the body 10, and the wall 22 upwardly extends from peripheral portions of the base plate 21, thus the outer surface of the body 10 and the wall 22 cooperatively define the groove 23 therebetween. In the instant embodiment, the wall 22 is substantially vertical but not limited hereto, the wall 22 may have various designs according to design specifications. For example, top end of the wall 22 can extend towards the operation end 101/coupling end 102 to resemble a barb-like contour (not shown in figures) or the wall 22 can slant towards or from the body 10. The appearance and physical dimensions of the groove 23 are not limited to the examples provided herein and are interchangeable according to design specification.

Preferably, the skirt member 20 can further include a buffering wall 24 outwardly and downwardly extending from the coupling end 102. The base plate 21 is outwardly extended from peripheral portions of the buffering wall 24. The buffering wall 24 can further include a slanting portion 241 outwardly and downwardly extending from the coupling end 102, and a descending portion 242 downwardly extending from the slanting portion 241. The base plate 21 is outwardly extended from peripheral portions of the descending portion 242. In this embodiment, the body 10, the buffering wall 24, base plate 21, and the wall 22 can be integrally formed in one piece, thus the descending portion 242 and the wall 22 cooperatively define the groove 23 therebetween. With the skirt member 20 structure as disclosed, small particles and dust can be captured and confined.

Figure 3:
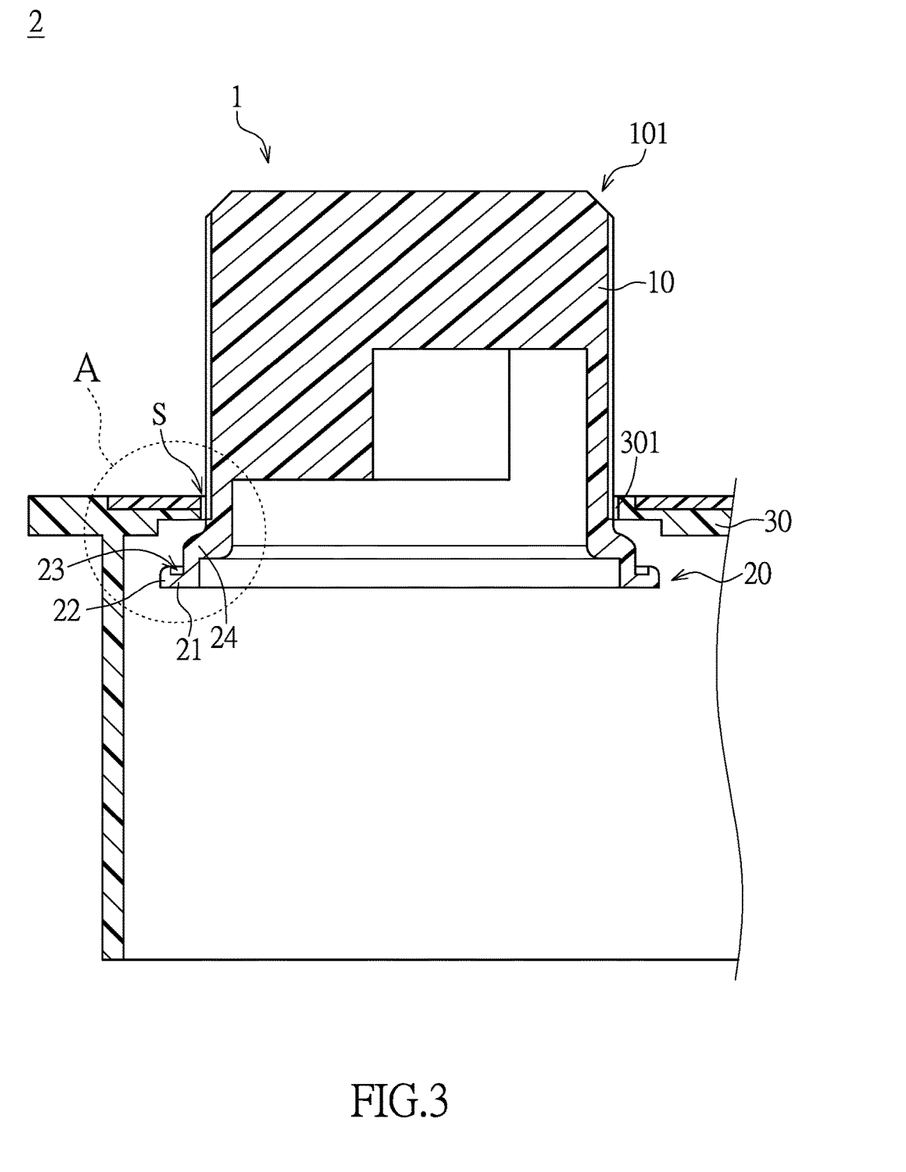
FIG. 3 is a cross-sectional view of the body of the operation member passing through an opening of a casing in accordance with the instant disclosure.
Figure 4:
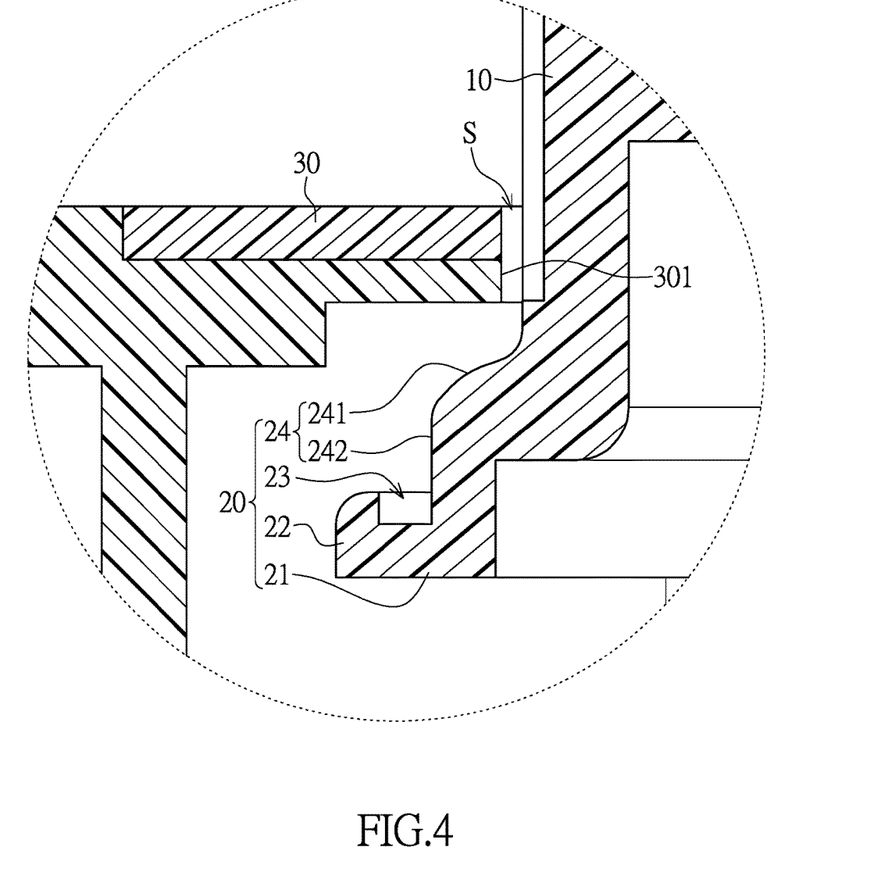
FIG. 4 is a detail view of Section A in FIG. 3 in accordance with the instant disclosure.

As shown in FIGS. 3 and 4, a casing 30 has portion defining an opening 301. The body 10 passes through the opening 301 of the casing 30. An outer surface of the body 10 and the opening 301 cooperatively define a gap S therebetween, such that the knob 1 is free to rotate. The skirt member 20 of the knob 1 correspondingly arranged or positioned under the gap S. For example, the buffering wall 24 can be correspondingly arranged under the gap S as shown in figures. However, the appearance of the buffering wall 24 is not limited to the examples provided in the figures and is interchangeable with design specifications as necessary. The descending portion 242 can be configured to be non-vertical with respect to the base plate 21, and can also slant toward away from the outer surface of the body 10.

When small particles (such as dust, powder, wood chips, ashes, etc) enter through the gap S, the small particles can be guided along the slanting portion 241 and the descending portion 242 of the buffering wall 24, and be collected into the groove 23 rather than falling onto circuit boards (not shown in figures) below the knob 1, thus preventing small particles from contaminating, damaging or even reducing the product life of the circuit board. The slanting portion 241 of the buffering wall 24 can be slanted at first and eventually comes to a leveled portion, so that small particles entering the gap S are first gathered at the slanting potion 241, and then fall into the groove 23 after a certain volume of small particles is gathered. In other words, the degree of slant of the slanting portion 241 can be adjusted as the first line of defense that prevents small particles from entering the circuit board or, alternatively, the slanting portion 241 can be a guide for small particles to enter into the groove 23.

Notably, when a pulling force is applied onto the operating end 101 of the body 10, the slanting portion 241 of the buffering wall 24 abuts periphery of the opening 301, such that the knob or the operation member 1 cannot be pulled out from the opening 301. In other words, the buffering wall 24 of the skirt member 20 in the instant embodiment can guide small particles from the gap S to enter into the groove 23, and can also prevent the knob 1 from pulling out from the opening 301.

Specifically, the skirt member has the buffering wall as an example in the instant embodiment but is not limited thereto. The skirt member can also be without the buffering wall. If the buffering wall is not included in the skirt member, when the body of the knob or operation member passes through the opening, the groove is directly arranged underneath the gap, such that small particles entering the gap can directly fall into the groove. Preferably, the groove has a width larger than or equal to that of the gap, so that when the wall is positioned below the casing and the operating end of the body is being pulled, the wall abuts inner surfaces of the casing and prevent the knob or the operation member from being pulled out from the opening.

In summary, the operation member of the instant embodiment can effectively block and gather small particles via the groove of the skirt member, by preventing small particles contamination from affecting normal operations of circuit boards located below the operation member as the small particles enter through the gap between the operation member and the opening. In addition, the structural design of the buffering wall of the skirt member further guides small particles entering through the gap towards the groove in the instant embodiment. The slanting portion of the buffering wall further provides an area for gathering of small particles. In other words, the slanting portion of the buffering wall not only guides small particles to enter into the groove, but also gathers small particles.

Moreover, since the skirt member is arranged below the casing in the instant embodiment but not positioned directly below the opening, when the operating end of the operation member is being pulled on, the operation member is prevented from being pulled out through the opening by the mutual abutment between the wall or the buffering wall of the skirt member and the inner surfaces of the casing. In other words, the operation member of the instant embodiment not only effectively blocks and collects small particles from entering through the gap, but also prevents the operation member from being pulled out from the opening.

Figure 5:
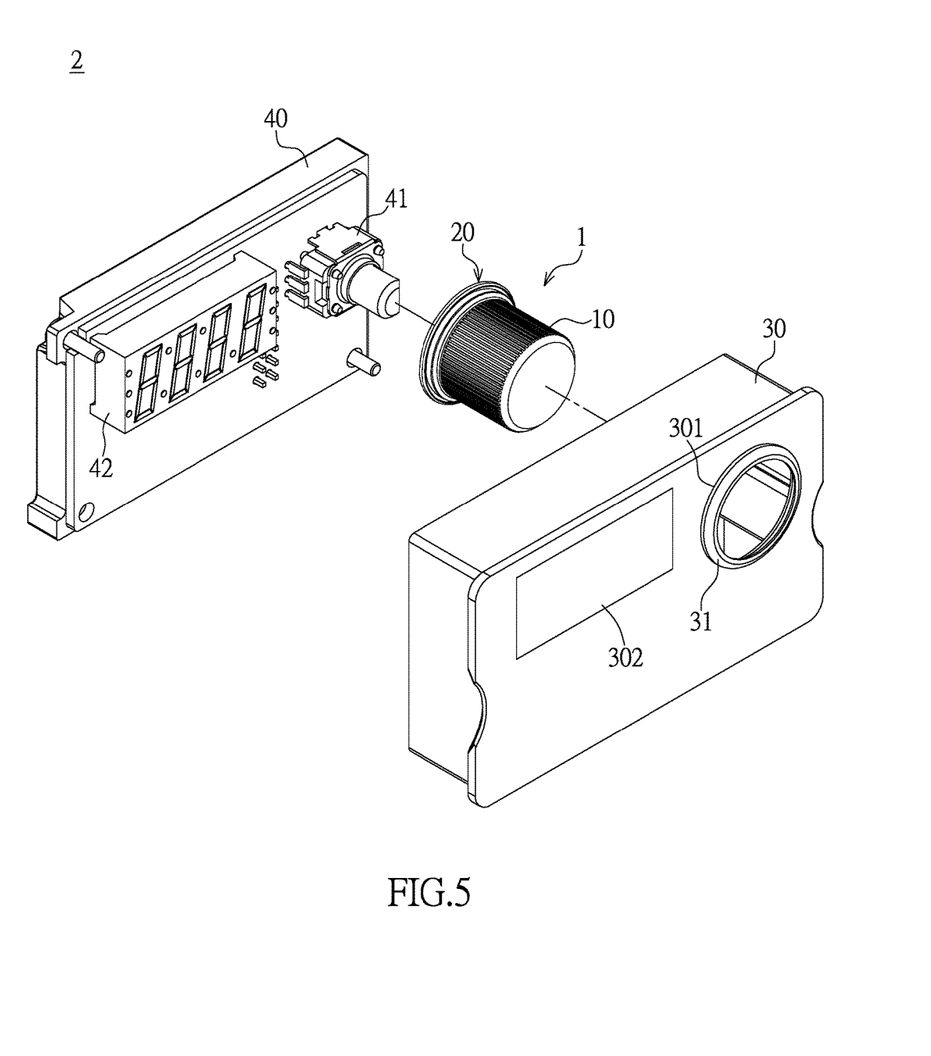
FIG. 5 is an exploded view of an electronic device having the operation member in accordance with the instant disclosure.
Figure 6:
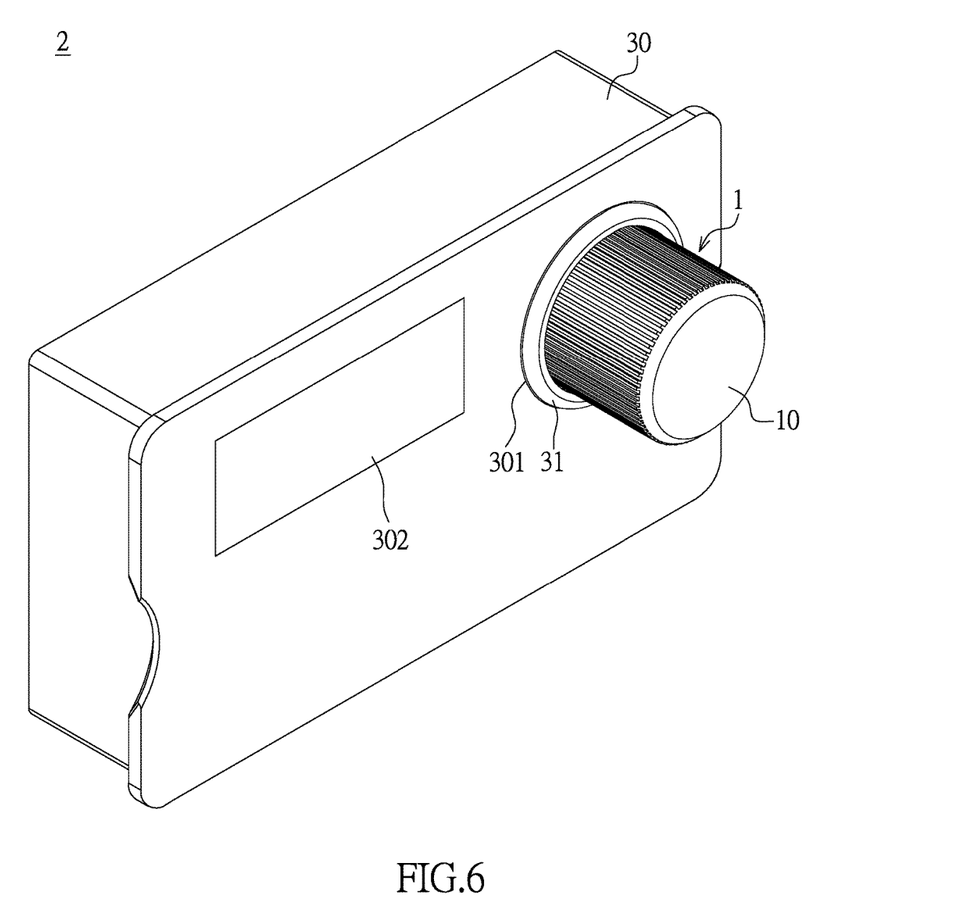
FIG. 6 is an assembled view of the electronic device having the operation member in accordance with the instant disclosure.

FIGS. 5 to 8 illustrate schematic diagrams of an electronic device having the operation member in accordance with the instant disclosure. As shown in FIGS. 5 to 6, the electronic device 2 includes a casing 30, an operation member 1 and a circuit module 40. The casing 30 has at least one opening. Two openings 301, 302 (opening 301 is for the installment of the operation member 1 and opening 302 is for the installment of other electronic components) are provided in the instant embodiment, but are not limited to the example provided herein. Peripheral portions of the casing 30 proximate to the opening 301 can further include an annular shielding structure 31 arranged thereon for partially shielding the peripheral portions of the opening 301. The circuit module 40 has a controller 41 and an electrical unit 42. The operation member 1, for example, a knob includes a body 10 and a skirt member 20. Details of the operation member 1 are identical to the embodiment as aforementioned, thus are not further described. The controller 41 of the instant embodiment is a rotatable variable resistor, whereas the electrical unit 42 is a display unit for example, both of which are not limited to the examples provided herein. Types and properties of the electrical unit 42 and the corresponding opening 302 are not further described here.

Figure 7:
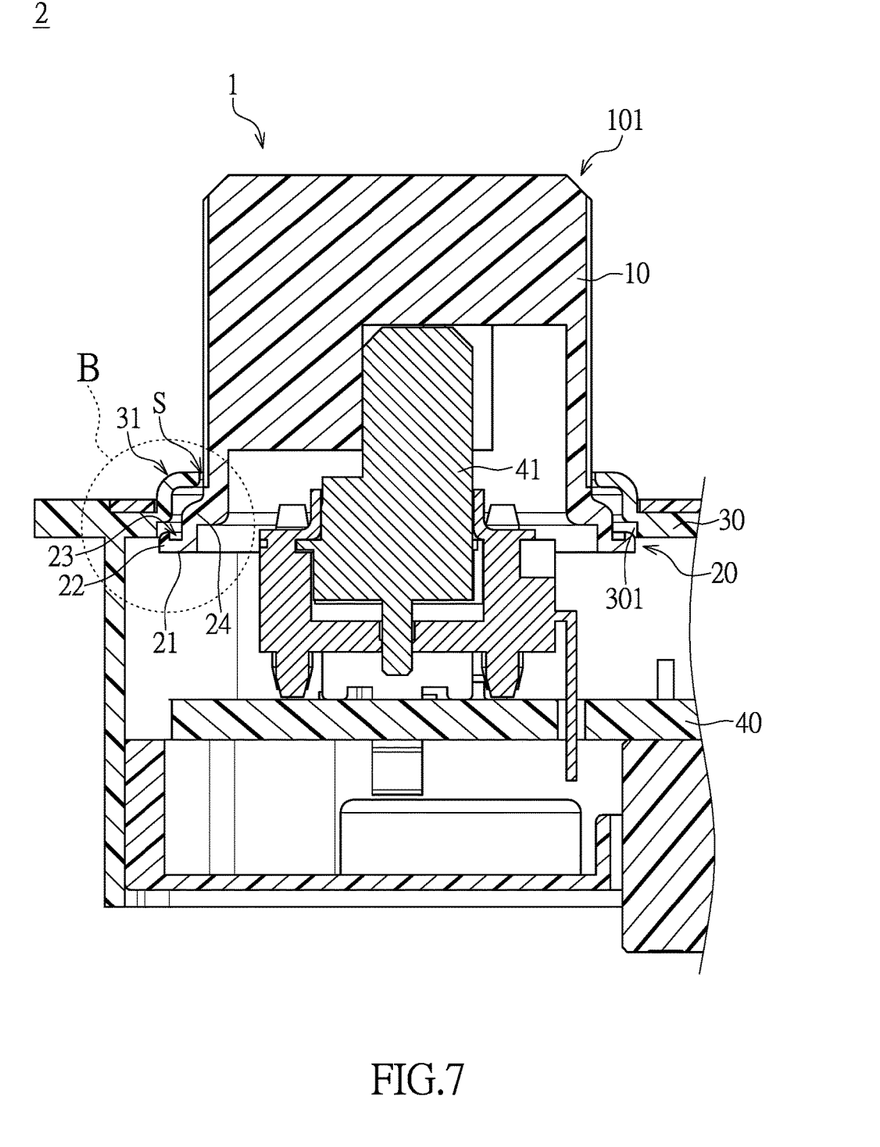
FIG. 7 is a cross-sectional view of the electronic device having the operation member in accordance with the instant disclosure.
Figure 8:
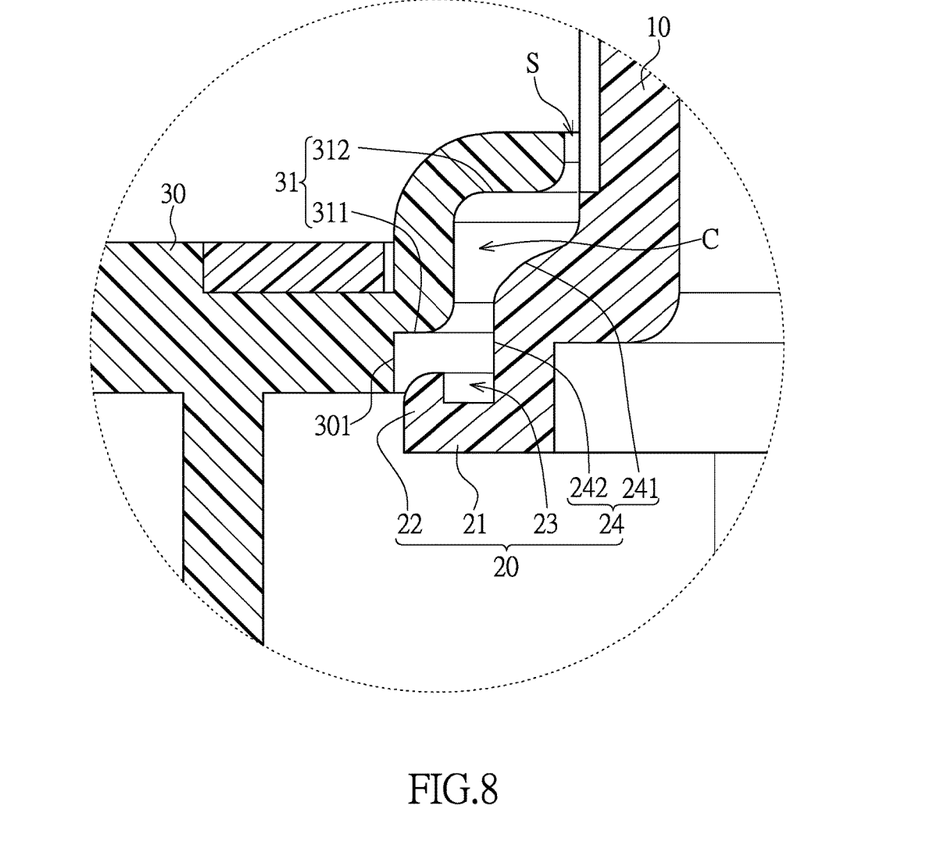
FIG. 8 is a detail view of Section B in FIG. 7 in accordance with the instant disclosure.

As shown in FIGS. 7 and 8, a cross-sectional view illustrating the knob 1 is sleeved onto the controller 41 as the body 10 passes through the opening 301 of the casing 30. The annular shielding structure 31 can be formed as an extension from the portions, sidewall, of the casing 30 defining the opening 301. The annular shielding structure 31 and outer surface of the body 10 can cooperatively define a gap S therebetween. The skirt member 20 of the knob or the operation member 1 is arranged below the annular shielding structure 31.

Specifically, the annular shielding structure 31 is formed by vertically extending (parallel with centerline of the opening 301) from the portions, sidewall, of the casing 30 defining the opening 301, and then horizontally extending (towards the centerline of the opening 301), such that a curvilinear channel C, for example, a maze-like channel is formed between inner surface of the annular shielding structure 31 and the buffering wall 24, outer surface, of the skirt member 20 as shown in FIG. 8. The vertically extending sidewall of the annular shielding structure 31 can be correspondingly arranged above the groove 23, whereas the horizontally extending sidewall of the annular shielding structure 31 can be correspondingly arranged above the slanting portion 241. Namely, inner surface of the annular shielding structure 31 can conform to the outer appearance or contour of the buffering wall 24 of the skirt member 20. Preferably, the groove 23 has a width larger than or equal to that of a width between the vertically extending sidewall of the annular shielding structure 31 and the descending portion 242 of the buffering wall 24, such that the groove 23 can enhance collection of small particles falling through the curvilinear channel C.

Small particles typically fall through the gap S due to gravity, and enter into the electronic device 2. However, in the instant embodiment, due to the horizontally and vertically formed curvilinear channel C, small particles are prevented from further falling. Typically, a large portion of the small particles cannot fall through the curvilinear channel C after entering the gap S and gather on the slanting portion 241 of the buffering wall 24, whereas a smaller portion of small particles falls down along the slanting portion 241 and gathers in the groove 23 due to the vertically extending sidewall of the annular shielding structure 31 and the descending portion 242 of the buffering wall 24. Notably, the portions of small particles not yet gathered at the slanting portion 241 are guided by the vertically extending sidewall of the annular shielding structure 31 and the descending portion 242, and fall into the groove 23. In other words, the annular shielding structure 31 and the buffering wall 24 of the skirt member 20 of the instant embodiment form the curvilinear channel C to provide barrier and collection of small particles entering the gap S and substantially reduce the possibility of small particles entering into circuit modules 40. Thus, damages that lead to reduction of product life of the circuit module 40 can be reduced along with the reduction in small particles entering the circuit module 40.

Notably, after the annular shielding structure 31 vertically and then horizontally extends from the sidewall of the opening 301, the sidewall simultaneously forms a first blocking portion 311 and a second blocking portion 312. The first blocking portion 311 corresponds to the wall 22 of the skirt member 20, whereas the second blocking portion 312 corresponds to the buffering wall 24 of the skirt member 20. When the operating end 101 of the body 10 is being pulled on, the wall 22 and the buffering wall 24 of the skirt member 20 can respectively abut the first blocking portion 311 and the second blocking portion 312 to prevent the body 10 from being pulled away from the opening 301.

In summary, the electronic device in the instant embodiment prevents small particles from entering into the circuit module via the annular shielding structure arranged at peripheral portions of the casing defining the opening and the buffering wall of the skirt member. Specifically, with the curvilinear channel formed between inner surface of the annular shielding structure and outer surface of the buffering wall of the skirt member, most small particles entering through the gap cannot easily move around and instead gather in the slanting portion of the buffering wall or in the groove, such that small particles that may cause damages to the circuit module are prevented from entering into the circuit module. Furthermore, the operation member is prevented from pulling out from the opening via the contours of the first and second blocking portions of the annular shielding structure that conform to the contour of the skirt member.

The figures and descriptions supra set forth illustrated the preferred embodiments of the instant disclosure; however, the characteristics of the instant disclosure are by no means restricted thereto. All changes, alternations, combinations or modifications conveniently considered by those skilled in the art are deemed to be encompassed within the scope of the instant disclosure delineated by the following claims.

What is claimed is:

1. An operation member for an electronic device that comprises a casing having portions defining an opening, and a circuit module having a circuit board, the circuit board including a controller disposed thereon, the operation member comprising:
   a body including an operating end and a coupling end, the body being configured to partially protrude through the opening of the casing for operating; and
   a skirt member arranged on the coupling end, the skirt member including a base plate outwardly extending from peripheral portions of the coupling end, a wall upwardly extending from peripheral portions of the base plate, and a groove defined between the wall and the body;
   wherein the operation member is configured to associate with the electronic device, and an outer surface of the body and the opening cooperatively define a gap therebetween;
   wherein the casing and the skirt member are not in contact with each other.

2. The operation member as recited in claim 1, wherein when the body passes through the opening of the casing, the outer surface of the body and the opening cooperatively define the gap therebetween, and the groove is correspondingly arranged beneath the gap.

3. The operation member as recited in claim 2, wherein the groove has a width larger or equal to a width of the gap.

4. The operation member as recited in claim 3, wherein the wall is arranged under the casing, and when the body is pulled outwards, the wall abuts inner portions of the casing.

5. The operation member as recited in claim 1, wherein the skirt member further comprising:
a buffering wall outwardly and downwardly extending from the coupling end of the body, and the base plate outwardly extending from the buffering wall.

6. The operation member as recited in claim 5, wherein the buffering wall has a slating portion outwardly and downwardly extending from the coupling end and a descending portion downwardly extending from the slanting portion.

7. The operation member as recited in claim 6, wherein when the body passes through the opening of the casing, the body and the opening cooperatively define a gap therebetween, the slanting portion of the buffering wall is correspondingly arranged beneath the gap to guide small particles entering from the gap to the groove.

8. The operation member as recited in claim 1 is a knob.

9. The operation member as recited in claim 1, wherein the skirt member is integrally formed with the body in a one piece construction.

10. An electronic device, comprising:
a casing having portions defining an opening;
an operation member, comprising:
a body including an operating end and a coupling end, the body being configured to partially protrude through the opening of the casing for operating; and
a skirt member arranged on the coupling end, the skirt member including a base plate outwardly extending from peripheral portions of the coupling end, a wall upwardly extending from peripheral portions of the base plate, and a groove defined between the wall and the body; and
a circuit module having a circuit board, the circuit board including a controller disposed thereon;
wherein the operation member is sleeved onto the controller and the body of the operation member passes through the opening, an outer surface of the body and the opening cooperatively define a gap therebetween, and the groove is correspondingly arranged beneath the gap;
wherein the casing and the skirt member are not in contact with each other.

11. The electronic device as recited in claim 10, wherein the casing has an annular shielding structure conformingly arranged proximate to portions defining the opening, the skirt member is correspondingly arranged below the annular shielding structure.

12. The electronic device as recited in claim 11, wherein the skirt member further comprising:
a buffering wall outwardly and downwardly extending from the coupling end of the body, and the base plate outwardly extending from the buffering wall.

13. The electronic device as recited in claim 12, wherein the buffering wall has a slating portion outwardly and downwardly extending from the coupling end and a descending portion downwardly extending from the slanting portion to guide small particles entering from the gap to the groove.

14. The electronic device as recited in claim 13, wherein the annular shielding structure has a first blocking portion correspondingly arranged with respect to the wall and a second blocking portion correspondingly arranged with respect to the slanting portion, when the body is pulled out, the wall correspondingly abuts the first blocking portion and the slanting portion correspondingly abuts the second blocking portion.

15. The electronic device as recited in claim 12, wherein the annular shielding structure has an inner surface conformingly formed with respect to an outer surface of the buffering wall of the skirt member, and the outer surface of the buffering wall and the inner surface of the annular shielding structure cooperatively define a curvilinear channel therebetween.

16. The electronic device as recited in claim 15, wherein the annular shielding structure is formed by portions of the casing defining the opening to vertically extend, and horizontally extend towards a centerline of the opening, the vertically extending portions of the annular shielding structure are correspondingly arranged above the groove, whereas the horizontally extending portions of the annular shielding structure are correspondingly arranged above the slanting portion.

17. The operation member as recited in claim 10 is a knob.

18. An operation member, comprising:
a body including an operating end for operating and a coupling end; and
a skirt member arranged on the coupling end, the skirt member including a base plate outwardly extending from peripheral portions of the coupling end, a wall upwardly extending from peripheral portions of the base plate, and a groove defined between the wall and the body;
wherein the skirt member and the body of the operation member are unitarily formed as a one piece structure;
wherein an outer surface of the body and an opening of a casing cooperatively define a gap therebetween, and the casing and the skirt member are not in contact with each other.

* * * * *